US011125791B2

(12) United States Patent
Cardozo et al.

(10) Patent No.: US 11,125,791 B2
(45) Date of Patent: *Sep. 21, 2021

(54) MANAGING OUTAGE DETECTIONS AND REPORTING

(71) Applicant: Landis+Gyr Innovations, Inc., Alpharetta, GA (US)

(72) Inventors: Ruben E. Salazar Cardozo, Johns Creek, GA (US); James Randall Turner, Alpharetta, GA (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/836,164

(22) Filed: Mar. 31, 2020

(65) Prior Publication Data

US 2020/0382972 A1 Dec. 3, 2020

Related U.S. Application Data

(60) Provisional application No. 62/854,553, filed on May 30, 2019.

(51) Int. Cl.
*H04W 24/04* (2009.01)
*G01R 22/06* (2006.01)
(Continued)

(52) U.S. Cl.
CPC .......... *G01R 22/068* (2013.01); *G01R 31/08* (2013.01); *H02H 1/0007* (2013.01); *H02H 3/04* (2013.01);
(Continued)

(58) Field of Classification Search
CPC ..................................................... H04W 24/04
(Continued)

(56) References Cited

U.S. PATENT DOCUMENTS 6,332,072 B1 12/2001 Johnson et al.
9,679,255 B1 6/2017 Mullaly et al.
(Continued)

FOREIGN PATENT DOCUMENTS

WO 2008033514 3/2008

OTHER PUBLICATIONS

U.S. Appl. No. 16/211,867, Non-Final Office Action, dated Feb. 28, 2020, 35 pages.
(Continued)

*Primary Examiner* — Dang T Ton
(74) *Attorney, Agent, or Firm* — Kilpatrick Townsend & Stockton LLP

(57) ABSTRACT

Systems and methods are disclosed for detecting node outages in a mesh network. A tracking node in the mesh network detects a set of signals originating from a tracked node in the mesh network. The set of signals includes beacons and communication messages transmitted by the tracked node. The tracking node determines that a threshold number of the alive beacon intervals have passed since receiving a most recent signal from the tracked node. The tracking node then outputs a ping to the tracked node requesting a response to the ping. When the response to the ping is not received from the tracked node, the tracking node transmits an outage alarm message to a next topologically higher layer of the mesh network, the outage alarm message comprising an identification of the tracked node.

14 Claims, 8 Drawing Sheets

(51) Int. Cl.
*G01R 31/08* (2020.01)
*H02H 1/00* (2006.01)
*H02H 3/04* (2006.01)
*H04L 12/26* (2006.01)
*H04L 29/08* (2006.01)
*H04W 24/08* (2009.01)
*H04B 1/69* (2011.01)
*H04W 84/18* (2009.01)

(52) U.S. Cl.
CPC .......... *H04L 43/106* (2013.01); *H04L 69/324* (2013.01); *H04W 24/04* (2013.01); *H04W 24/08* (2013.01); *H04B 2001/6908* (2013.01); *H04W 84/18* (2013.01)

(58) Field of Classification Search
USPC ........................................................ 370/329
See application file for complete search history.

(56) References Cited

U.S. PATENT DOCUMENTS

| | | | |
|---|---|---|---|
| 10,056,159 | B1 | 8/2018 | Patel et al. |
| 2005/0044211 | A1 | 2/2005 | Adhikari |
| 2010/0172258 | A1 | 7/2010 | Yang et al. |
| 2012/0192025 | A1 | 7/2012 | Veillette |
| 2013/0166641 | A1 | 6/2013 | Kan et al. |
| 2014/0085105 | A1 | 3/2014 | Vaswani et al. |
| 2014/0105037 | A1 | 4/2014 | Manthiramoorthy |
| 2016/0226575 | A1 | 8/2016 | Subramani |
| 2017/0070563 | A1 | 3/2017 | Sundermeyer et al. |
| 2017/0134395 | A1 | 5/2017 | Enns et al. |
| 2017/0272317 | A1 | 9/2017 | Singla et al. |
| 2017/0310396 | A1 | 10/2017 | Yoshizawa |
| 2018/0091989 | A1 | 3/2018 | Baroudi et al. |
| 2018/0196972 | A1 | 7/2018 | Lu et al. |
| 2018/0212568 | A1 | 7/2018 | Chu et al. |
| 2018/0263008 | A1 | 9/2018 | Poorrezaei |
| 2018/0331914 | A1 | 11/2018 | Yoshida et al. |
| 2019/0028986 | A1 | 1/2019 | Poorrezaei et al. |
| 2019/0104056 | A1 | 4/2019 | Poorrezaei et al. |
| 2019/0246329 | A1 | 8/2019 | Abouelmaati et al. |
| 2020/0022005 | A1 | 1/2020 | Campos et al. |
| 2020/0106582 | A1 | 4/2020 | Jalali |
| 2020/0170074 | A1 | 5/2020 | Klausen et al. |
| 2020/0382973 | A1* | 12/2020 | Cardozo ............... H04L 43/106 |

OTHER PUBLICATIONS

Li et al., "Robust Networking for Bandwidth Constrained Mobile Tactical Radio", IEEE 75th Vehicular Technology Conference (VTC Spring), May 6, 2012, 5 pages.

McCarthy et al., "An Efficient Broadcast Query Forwarding Technique for Wireless Multipath Routing", 24th IEEE International Performance, Computing, and Communications Conference, Apr. 7, 2005, pp. 337-346.

International Patent Application No. PCT/US2019/064127, Invitation to Pay Additional Fees and Partial Search Report dated Mar. 19, 2020, 13 pages.

Uchiyama et al., "Neighbor Selection Algorithm for Ad Hoc Networks with Highly Dynamic Urban Mobility", Wireless Communications and Mobile Computing, IWCMC, International, IEEE, Aug. 6, 2008, pp. 165-170.

U.S. Appl. No. 16/211,867, Non-Final Office Action dated Aug. 12, 2020, 39 pages.

International Patent Application No. PCT/US2020/035248, International Search Report and Written Opinion, dated Nov. 9, 2020, 20 pages.

Li et al., "Robust Networking for Bandwidth Constrained Mobile Tactical Radio", Institute of Electrical and Electronics Engineers 75th Vehicular Technology Conference, May 6, 2012, 5 pages.

McCarthy et al., "An Efficient Broadcast Query Forwarding Technique for Wireless Multipath Routing", 24th Institute of Electrical and Electronics Engineers International Performance, Computing, and Communications Conference, Apr. 7, 2005, pp. 337-346.

Uchiyama et al., "Neighbor Selection Algorithm for Ad Hoc Networks with Highly Dynamic Urban Mobility", 2008 International Wireless Communications and Mobile Computing Conference, Aug. 6, 2008, pp. 165-170.

International Patent Application No. PCT/US2020/035256, International Search Report and Written Opinion, dated Oct. 6, 2020, 14 pages.

International Patent Application No. PCT/US2020/035282, International Search Report and Written Opinion, dated Sep. 24, 2020, 13 pages.

U.S. Appl. No. 16/211,867, Notice of Allowance, dated Jan. 22, 2021, 19 pages.

U.S. Appl. No. 16/887,950, Non-Final Office Action, dated Feb. 3, 2021, 16 pages.

U.S. Appl. No. 16/836,200, Notice of Allowance dated Mar. 24, 2021, 19 pages.

* cited by examiner

MANAGING OUTAGE DETECTIONS AND REPORTING

RELATED APPLICATION

This application claims priority to U.S. Prov. App. No. 62/854,553, titled "Managing Outage Detections and Reporting" and filed on May 30, 2019, which is incorporated herein in its entirety. This application is also related to U.S. Ser. No. 16/211,867, filed Dec. 6, 2018, which is incorporated herein in its entirety by reference.

TECHNICAL FIELD

This disclosure relates generally to processes for detecting and reporting node outages (e.g., communication outage, premise power outage, or grid power outage) and alarm events within a wireless network.

BACKGROUND

Networked systems, such as networks of smart power, gas, and water meters and other smart devices (i.e., devices capable of connecting to and communicating with other devices or networks), are capable of interconnecting with each other for interdevice communication. Further, one or more of the smart devices within the networked systems may be capable of interconnecting with the internet or other networks. For example, a networked system provides the smart devices with a mechanism to communicatively couple with one another and exchange data. The networked system may include one or more nodes that connect to a network (e.g., the internet or an intranet) either directly or indirectly through additional layers of parent and root nodes or collectors. The networked system may also include nodes that link with the parent nodes or other child nodes to exchange data across the networked system.

Certain issues arise with node reliability and node outage detection and reporting for nodes within the networked system. For example, the nodes may rely on a supercapacitor to provide sufficient energy for the node to transmit an outage indication after the node stops receiving power from a primary power source of the node. Over time, liquid (e.g., an electrolyte mixture) stored within the supercapacitor may leak, and the leaking liquid may short electrical components and result in a premature breakdown of the node. Additionally, outage indications transmitted by the node powered by the supercapacitor may not always be detected by other nodes in the networked system due to a lossy nature of communication across the networked system. Accordingly, the outage indication may never be received by other nodes in the networked system and reported to a head-end system. Thus, outage events of nodes in the networked system may not be adequately or consistently detected and reported to the head-end system for further remediating action.

SUMMARY

Aspects and examples are disclosed for apparatuses and process for node outage and alarm event determinations and reporting in a networked system of smart devices. For instance, a method for detecting node outage in a mesh network includes: during a first time period, detecting, by a first node of the mesh network, a set of signals originating from a second node of the mesh network tracked by the first node. The set of signals comprises RF alive beacons and communication messages transmitted by the second node and the RF alive beacons indicate an operational status of the second node. The set of signals are detected during a time period that corresponds to at least a single alive beacon interval. The method further includes during a second time period subsequent to the first time period, determining, at the first node, that a threshold number of the alive beacon intervals have passed since receiving a most recent signal from the second node. The method also includes outputting, from the first node, a ping to the second node requesting a response to the ping. And when no response to the ping is received from the second node within a response period, transmitting, by the first node, an outage alarm message to a next topologically higher layer of the mesh network, the outage alarm message comprising an identification of the second node.

In another example, a node in a mesh network includes a processor configured to execute computer-readable instructions and a memory configured to store the computer-readable instructions that, when executed by the processor, cause the processor to perform operations. The operations include during a first time period, detecting a set of signals originating from a second node of the mesh network tracked by the node. The set of signals comprises RF alive beacons and communication messages transmitted by the second node and the RF alive beacons indicate an operational status of the second node. The set of signals are detected during a time period that corresponds to at least a single alive beacon interval. The operations further include during a second time period subsequent to the first time period, determining that a threshold number of the alive beacon intervals have passed since receiving a most recent signal from the second node, and outputting a ping to the second node requesting a response to the ping. When no response to the ping is received from the second node within a response period, the operations include transmitting an outage alarm message to a next topologically higher layer of the mesh network, the outage alarm message comprising an identification of the second node.

In yet another example, a method for facilitating outage detection includes during a first time period, transmitting, by a first node of a mesh network, an RF alive beacon for every alive beacon interval, the RF alive beacon indicating that the first node is operational. The method further includes, during a second time period subsequent to the first time period, transmitting one or more communication messages. The method also includes determining that at least one of the communication messages was transmitted during a most recent alive beacon interval and skipping transmission of an RF alive beacon for the most recent alive beacon interval.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
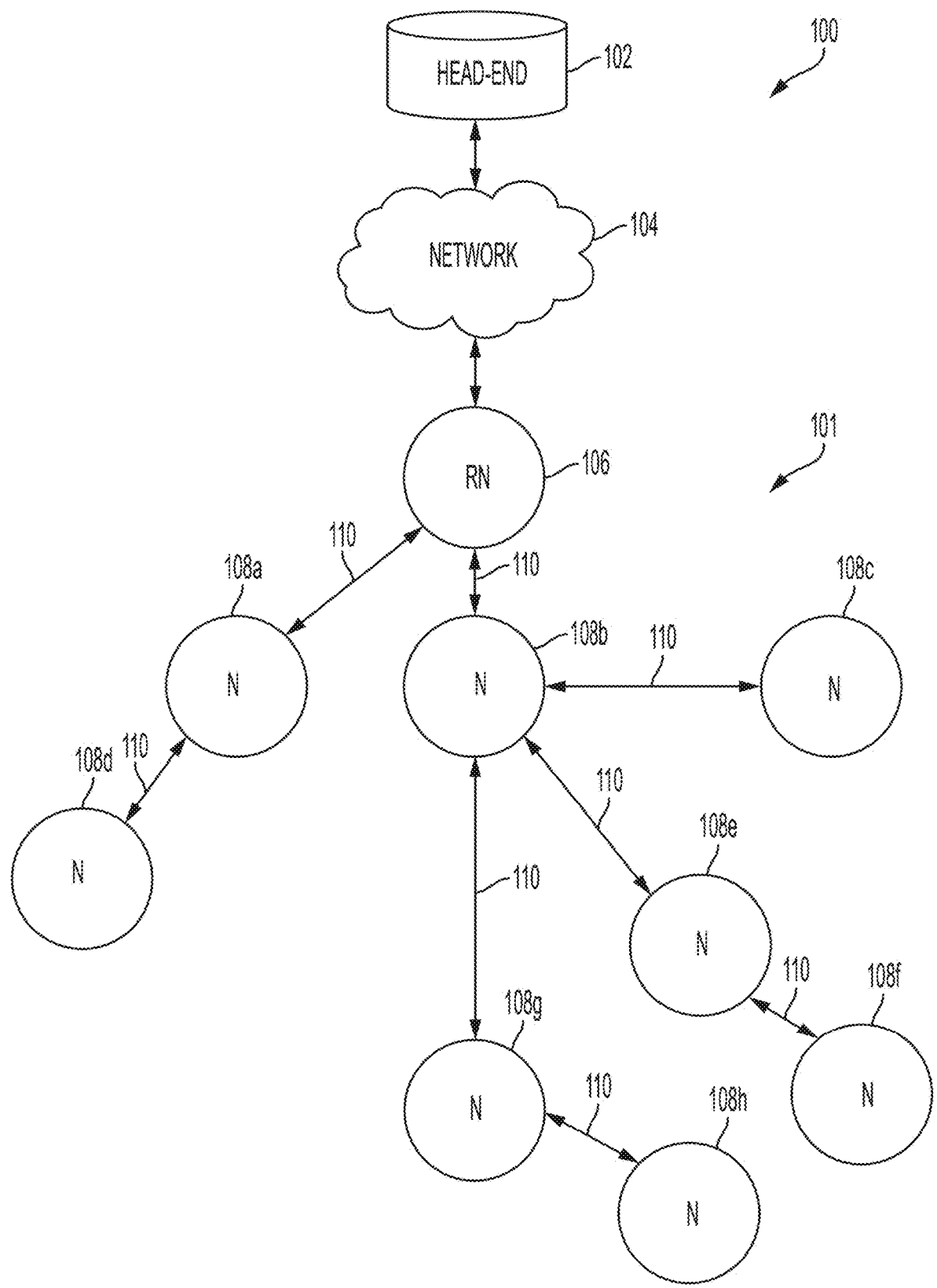
FIG. 1 is a block diagram illustrating an example of a networked system of smart devices, in accordance with one or more examples.

Systems and methods are provided for node outage and alarm event determinations and reporting in a networked system of smart devices. As used herein, a node outage can include the communication outage of a node, the premise power outage at the location of the node, or the grid power outage at the location of the node. Within the networked system, a node may be any point in the networked system capable of transmitting data to and receiving data from other nodes or a centralized network (e.g., the internet or an intranet). To provide proper accounting of statuses of the nodes connected to the networked system, the networked system includes a process that leverages node capabilities to manage node outage detection at the nodes connected to the networked system.

In operation, the nodes in the networked system may be configured to output a beaconing signal such as a radio frequency (RF) signal indicating that the nodes are operational, referred to herein as a "RF alive beacon" or "RF alive beacon signal." The RF alive beacon signal provides a preamble identifying the RF alive beacon signal as a beacon signal and also an identification of the node originating the RF alive beacon signal. The nodes may be configured to transmit the RF alive beacon signals when there are no other signals to transmit, such as the data messages or network communication messages. Other nodes (tracking nodes) in the network that can receive the RF alive beacon signals from a node (tracked node) can track the status of this node based on the RF alive beacon signal and other signals transmitted by the node.

If a tracking node does not receive signals from the tracked node for more than a specified number of alive beacon intervals, the tracking node may determine that the tracked node is in a suspected outage state. To confirm that the tracked node is indeed suffering an outage, the tracking node may ping the tracked node requesting a response from the tracked node indicating that the tracked node is still operational. If no response is received from the tracked node, the tracking node may transmit outage alarm messages through the layers of the networked system.

Each layer of the network system may process, filter, and consolidate the outage alarm messages such that a root node receives an indication of all non-functioning nodes in the networked system without or with minimum repeated indications of node outages. The root node, which may connect to a head-end system using a centralized network (e.g., the internet), may provide the indication of the non-functioning nodes as an alarm packet to the head-end system. At the head-end system, measures may be taken to address the non-functioning nodes. For example, technicians may be deployed to perform physical inspections and repairs on the non-functioning nodes. In another example, where the nodes are related to endpoints associated with a power grid, a number of non-functioning nodes may indicate a power outage. The information about the non-functioning nodes may be used to provide accurate outage information to customers or to identify the scope of the problem.

To reduce the likelihood of false-positive outage detection, tracking nodes can perform outage validation, for example, before sending the ping to the tracked nodes or after pinging the tracked nodes. The outage validation can be performed by configuring the nodes in the network to include the status of their respective tracked nodes in the RF alive beacons sent out by the individual nodes (also referred to as advanced RF alive beacon signals). In other words, an advanced RF alive beacon signal is a beacon that indicates the operational status of the node sending the RF alive beacon and includes status information for tracked nodes. A tracking node can thus update the status of the tracked node based on the advanced RF alive beacon signals sent by other nodes that also track the tracked node. The outage validation can also be performed by the tracking node requesting other tracking nodes of the tracked node for status information. If outage validation shows that the tracked node is still operational, the tracking node may refrain from sending the ping and/or the outage alarm messages. As a result, the likelihood of false positive outage detection and network traffic can be reduced.

To further increase the network efficiency, the nodes can be configured to support two media access control (MAC) protocols and may switch between listening for data or network management communication on one network and listening for RF alive beacon signals on another network (an RF beacon network). In this way, detecting the RF alive beacon signals can be performed when the node is not receiving data or network management communication thereby increasing the communication efficiency and reducing the interruption to the normal data or network management communication.

FIG. 1 is a block diagram illustrating an example of a networked system 100 and a mesh network 101. The networked system 100 and the mesh network 101 provides a network infrastructure for smart devices (e.g., resource consumption meters, vehicles, home appliances, etc. that include communication technology) to communicate across a network of nodes (i.e., other smart devices), the internet, and/or an intranet. The networked system 100 includes a head-end system 102, which may function as a central processing system that receives a stream of data from a network 104. The network 104 may be the internet, an intranet, or any other data communication network. The mesh network 101 may include a root node 106 and other nodes 108a-108h collecting data associated with the nodes 106 and 108a-108h, and the root node 106 transmits the collected data to the network 104 and ultimately to the head-end 102 of the networked system 100. In addition, the root node 106 may also receive from the head-end 102 network management messages and transmit the network management messages to the nodes 108a-108h. Likewise, the root node 106 itself or other nodes 108a-108h may also issue and transmit network management messages to other nodes 108a-108h. The data and network management transmitted between the nodes 106, 108a-108h may be collectively referred to herein as "communication messages." These communication messages are transmitted and routed through data links 110 between the nodes 106, 108a-108h. The root node 106 may be a personal area network (PAN) coordinator, an internet gateway, or any other device capable of connecting to the network 104.

The root node 106 may generally be referred to as a parent node due to data links with the nodes 108a and 108b that are located at a node layer (e.g., layer one) below the root node 106. For example, the root node 106 is illustrated as communicating directly with the network 104. As illustrated, nodes 108a and 108b may also be referred to as parent nodes due to data links with nodes 108c, 108d, 108e, and 108g that are located at a node layer (e.g., layer two) below the nodes 108a and 108b. Further, nodes 108e and 108g may be referred to as parent nodes due to data links with nodes 108f and 108h that are located at a node layer (e.g., layer three) below the nodes 108e and 108g. The nodes 108a-108h may all funnel information up through the node layers to the root node 106 and ultimately to the head-end 102.

Each of the nodes 106 and 108a-108h are linked with at least one of the other nodes 106 and 108a-108h. Links 110 may be created by storing neighboring node information in neighbor caches of the nodes 106 and 108a-108h that provide indications to the nodes 106 and 108a-108h of the other nodes 106 and 108a-108h through which data may be routed. For example, the neighbor cache of the node 108h may include neighboring node information identifying that data collected at the node 108h should be transmitted to the node 108g. Likewise, the neighbor cache of the node 108g may include neighboring node information identifying that the node 108g should transmit relevant information to the node 108h (e.g., network management messages or other information from the head-end 102) and also identifying that the node 108g should transmit data collected by the node 108g and data received from the node 108h to the node 108b. Such a data transmission scheme may continue up through the node layers of the mesh network 101.

In operation, fewer or more nodes 108 may be included in the mesh network 101, and more root nodes 106 may also be included in the networked system 100. Additionally, while the mesh network 101 depicted in FIG. 1 includes a root node layer (i.e., the root node 106), layer one (i.e., the nodes 108a and 108b), layer two (i.e., the nodes 108c, 108d, 108e, and 108g), and layer three (i.e., the nodes 108f and 108h), fewer or more node layers are also contemplated. Moreover, while FIG. 1 depicts a specific network topology (e.g., a DODAG tree topology), other network topologies are also possible (e.g., a ring topology, a mesh topology, a star topology, etc.).

The head-end system 102 may keep track of operational and non-operational nodes 106 and 108a-108h. To track the status of the nodes 106 and 108a-108h, the nodes 106 and 108a-108h transmit radio frequency (RF) beacon signals with enough strength to be received only by other nodes 106 and 108a-108h that are within close physical proximity to the transmitting nodes 106 and 108a-108h. These RF alive beacon signals can be utilized to indicate that the transmitting nodes 106 and 108a-108h are operational (i.e., does not suffer a power outage).

For example, the node 108h may transmit the RF beacon signals with only enough strength for the nodes 108e, 108f, and 108g to consistently receive the RF alive beacon signals. In an example, the RF alive beacon signals may be referred to as limited range beacons since the transmission strength of the RF alive beacon signals may be limited. The RF alive beacon signals are limited to reception by other nodes 106 and 108a-108h located within a transmission strength radius of the node sending the limited range beacon. In this manner, the RF alive beacon provides peer-to-peer communication between a subset of the nodes 106 and 108a-108h located within the transmission strength radius of the node sending the limited range beacon.

The RF alive beacon signals may include an identification of the node 106 or 108a-108h transmitting the RF alive beacon signals. For example, the RF alive beacon signals may include a preamble identifying the RF alive beacon signals as beacon signals and also an identification of the node 106 or 108a-108h originating the RF alive beacon signal. A representation with only the preamble and the node identification may be only 4-8 bytes of data, but a larger or a smaller sized RF alive beacon signal is also contemplated. Other information associated with the transmitting node 106 or 108a-108h is also contemplated as being included as part of the RF alive beacon signal.

In an example, the strength of the RF alive beacon signals output by each of the nodes 106 and 108a-108h may be adjusted such that between 5 and 10 other nodes 106 and 108a-108h receive the RF alive beacon signals from that individual node. In such an example, the strength of the RF alive beacon signal may be 0 dBm or a range from −3 dBm to 10 dBm, and the strength may be adjusted based on how many of the nodes 106 and 108a-108h are located within close proximity to the node 106 or 108a-108h transmitting the RF alive beacon signals. That is, the strength of the RF alive beacon signals may increase to reach additional nodes 106 and 108a-108h or decrease to reach fewer additional nodes 106 and 108a-108h depending on a specific arrangement of the additional nodes 106 and 108a-108h in the mesh network 101. In an example, when the strength of the RF alive beacon signal is such that 6 nodes receive the RF alive beacon signal with a success rate greater than 50%, a subsequent success rate that each RF alive beacon signal will reach at least one of the 6 nodes will be at least 98.4% (i.e., $1-0.5^6$). This success rate may increase based on an increase in the number of nodes 106 and 108a-108h within range of the transmitting node 106 or 108a-108h, based on an increase in the success rate of the individual receiving nodes 106 and 108a-108h, or both.

The RF alive beacon signals may be transmitted by each of the nodes 108a-108h at defined alive beacon intervals. For example, the nodes 108a-108h may transmit the RF alive beacon signals every 5 seconds. Longer or shorter alive beacon intervals are also contemplated. Additionally, each of the nodes 108a-108h may control their own alive beacon intervals, and synchronization of the alive beacon intervals may not be performed across the nodes 108a-108h. In an example, the period between RF alive beacon signals may be selected to achieve an optimal balance among one or more of the following factors: 1) increasing the uniform distribution of the RF alive beacon signals from the transmitting nodes, 2) minimizing the interference from other RF alive beacon signals or other RF transmissions of the mesh network, and 3) maximizing the resolution of outage event timestamps. For example, maximizing the resolution of the outage event timestamps may call for reducing the alive beacon intervals to a smaller time period, while minimizing interference from other RF sources may call for increasing the alive beacon intervals to a larger time period.

In some examples, the tracking node 106 or 108a-108h is capable of implementing two MAC protocols using a single transceiver device (e.g., a single radio) so that the data and network management communications can be performed using one MAC protocol and RF alive beacon communications can be performed using the other MAC protocol. Additional details about the implementation based on two MAC protocols are provided below with regard to FIGS. 2 and 3.

Over time, each of the nodes 106 and 108a-108h receive RF alive beacon signals from one or more other nodes 106 and 108a-108h. When the receiving nodes 106 and 108a-108h receive the RF alive beacon signals from one or more of the other nodes 106 and 108a-108h at a percentage of alive beacon intervals that is greater than a threshold percentage, the receiving nodes 106 and 108a-108h may track when the RF alive beacon signals from the one or more of the other nodes 106 and 108a-108h are missed. For example, the threshold percentage can be set to p %. If a receiving node 106 or 108a-108h receives RF alive beacon signals from another node 106 or 108a-108h during M alive beacon intervals out of a total of N alive beacon intervals, and M/N>p %, the receiving node (also referred to as "tracking node") may track the status of the transmitting node (also referred to as a "tracked node"). In the following description, node 108h is used as an example of a tracked node and node 108f is used as an example of a tracking node tracking the status of the tracked node 108h. It should be understood that any node 106 or 108a-108h in the mesh network can be a tracked node or a tracking node. In addition, a node 106 or 108a-108h may be a tracked node being tracked by other nodes and, at the same time, a tracking node tracking the status of other nodes.

The tracking includes determining the number of alive beacon intervals during which the RF alive beacon signal is not received. After missing the RF alive beacon signal for a predetermined number of alive beacon intervals from the tracked node 108h, the tracking node 108f may determine that the tracked node 108h is in a suspected outage state and may initiate a node ping process to proactively request a response from the tracked node 108h. In some examples, the tracking node 108f performs an outage validation before initiating the node ping process. For example, the tracking node 108f can perform the outage validation based on information contained in the advanced RF alive beacons received from other tracking nodes. In this example, the advanced RF alive beacon signal transmitted by a tracked node 106 or 108a-108h can be configured to include additional information, such as the status of other nodes 106 and 108a-108h. Since a tracked node 106 or 108a-108h can also be a tracking node tracking the status of other nodes 108a-108h, the tracked node 106 or 108a-108h is aware of the status of its tracked nodes 106 and 108a-108h and such status information can be included in the advanced RF alive beacon signal transmitted by the tracked node 106 or 108a-108h. As a result, any node that receives the advanced RF alive beacon signal sent by the tracked node 106 or 108a-108h can obtain the status of those nodes.

Continuing the above example, the tracking node 108f can perform the outage validation based on the advanced RF alive beacons received from one or more other nodes 106 and 108a-108h that are also tracking the tracked node 108h, such as node 108e. The tracking node 108f can compare the status of the tracked node 108h determined by itself and the status of the tracked node 108h indicated in the advanced RF alive beacons received from other nodes to determine whether the tracked node 108h is indeed in the outage status. For instance, the tracking node 108f may determine, after failing to receive RF alive beacons from the tracked node 108h for a predetermined number of alive beacon intervals, that the tracked node 108h is in a suspected outage status. However, if the advanced RF alive beacons received from other nodes indicates that the status of the tracked node 108h is operational, the tracking node 108f may update the status of the tracked node 108h to "operational" without initiating the node ping process. In this way, the false-positive outage indications can be reduced and the communications can be reduced (e.g., the communication involved in the node ping process is eliminated).

The outage validation process can also be performed by the tracking node 108f requesting other nodes (e.g., its neighboring nodes) for the status of the tracked node 108h. The response received from those nodes can be used to confirm that the tracked node 108h is in the suspected outage state. Additional details regarding the outage validation are provided below with respect to FIGS. 6 and 7. If the tracking node 108f confirms that the tracked node 108h is in a suspected outage state, the tracking node 108f may initiate the node ping process.

In an example, the node ping process may involve the tracking node 108f transmitting a ping (e.g., a request for a response) to the tracked node 108h. The node ping process provides an additional detection layer to make sure that the tracked node 108h is not functioning properly before transmitting an outage alarm message. The ping may be transmitted at full power strength of the tracking node 108f (e.g., 20 dBm-30 dBm). If the tracked node 108h is still operational, the tracked node 108h may transmit a message at full power strength back to the tracking node 108f indicating an operational status of the tracked node 108h. In such an example, the beaconing process may resume without escalating the outage alarm message to other node layers of the mesh network 101.

If the tracked node 108h is no longer operational, such as due to a sustained loss of power without an alternative power source, then no response to the ping is received at the tracking node 108f. To reduce the likelihood that the tracking node 108f failed to detect the response, the node ping process may be repeated two or more times. By repeating the node ping process, the likelihood of a false-positive outage detection of the tracked node 108h may decrease significantly.

When the tracking node 108f does not receive a response from the tracked node 108h during the node ping process, the tracking node 108f may build an outage alarm message to be directed up the node layers of the mesh network 101. The outage alarm message may include an identification of the tracked node 108h that is not functioning and also an indication of a time stamp of a most recent RF alive beacon signal (or other communications if these other communications are also used to detect outage of the tracked node) received by the tracking node 108f from the tracked node 108h. In an example, the tracking node 108f may combine the outage alarm message for the tracked node 108h with outage alarm messages for other tracked nodes. Such a package may be referred to as an alarm packet and be sent as a data message to the nodes in a next higher node level.

In some examples, if, after transmitting the alarm packet up through the layered topology of the network, the tracking node 108f receives an RF alive beacon from the tracked node 108h, the tracking node 108f can mark the tracked node 108h as "restored" or "operational" and continue to track the status of the tracked node 108h as described above. In an example, upon marking the tracked node 108h as "restored," the tracking node 108f may transmit a node-restored message up through the layered topology of the mesh network 101. The node-restored message may include an identification of the restored node 108h.

When an alarm packet (e.g., a data packet including an indication of multiple tracked nodes 106 and 108a-108h that are in an outage state determined by one tracking node or multiple tracking nodes) is received at a node 106 or 108a-108h in a next higher node level, such as at node 108e, a filtering and consolidation process may occur to prevent transmission of unnecessary or repeat outage indications. For example, the node 106 or 108a-108h that receives the alarm packet may parse the alarm packet into multiple endpoint identifications that indicate which of the nodes 106 and 108a-108h are indicated in the alarm packet as being in an outage. The endpoint identifications are analyzed by the node 106 or 108a-108h for repeat alarm indications (e.g., if the node 106 or 108a-108h already knows of one or more of the nodes 106 and 108a-108h that are in an outage). The non-repeat alarm indications are stored for further analysis.

The stored alarm indications are then cross-referenced to see if any of the stored alarm indications come from one of the nodes 106 or 108a-108h that the analyzing node 106 or 108a-108h monitors for RF alive beacon signals. If not, the analyzing node 106 or 108a-108h forwards the alarm packet to a next higher node layer of the mesh network 101. If one or more of the stored alarm indications correspond to nodes monitored by the analyzing node 106 or 108a-108h, the analyzing node 106 or 108a-108h determines if an RF alive beacon signal was received for the one or more stored alarm indications to ensure that the RF alive beacon signal was not missed by the node 106 or 108a-108h in the topologically lower node layer of the mesh network 101. If the RF alive beacon signal was not received by the analyzing node 106 or 108a-108h, the analyzing node 106 or 108a-108h may forward the alarm packet to the next topologically higher node layer of the mesh network 101. If the RF alive beacon signal was received by the analyzing node 106 or 108a-108h, the analyzing node 106 or 108a-108h may remove the node 106 or 108a-108h providing the RF alive beacon signal from the alarm packet before transmitting an updated alarm packet to the next topologically higher node layer of the mesh network 101. This process involves filtering out repeat alarm indications from alarm packets and also removing false-positive outage indications from the alarm packets prior to transmitting the alarm packet to the next topologically higher node layer of the mesh network 101.

When the head-end 102 receives the alarm packet from the root node 106, the head-end 102 may deploy technicians to address the one or more nodes 106 and 108a-108h indicated by the alarm packet as being in an outage. For example, the technician may be deployed to repair or replace the nodes 106 and 108a-108h identified by the alarm packet. Further, the head-end 102 may maintain a record of the nodes 106 and 108a-108h that are in an outage.

It should be understood that while the above description focuses on relying on the RF alive beacon signals to determine the status of the tracked node, other communications sent by the tracked node can also be utilized. For example, the tracking node can act as a "promiscuous node" and sniff or listen for any type of communications sent by the tracked node. The tracking node considers both RF alive beacon signals and other communications sent by the tracked node when determining whether the tracked node is in the operational status. The communications include data communications and network management communications. Since the transmit power of the data or network management communications sent by the tracked node may be higher than the RF alive beacon signal sent by the tracked node, the probability that the tracking node will receive the data or network management communications may be higher than the probability that the tracking node will receive the RF alive beacon signal.

If the tracking node detects communication messages transmitted from the tracked node, the tracking node can determine that the tracked node is operational even if no RF alive beacon is received from the tracked node for more than the predetermined number of alive beacon intervals. In some examples, a counter of missed intervals can be used to keep track of the number of consecutive alive beacon intervals when no RF alive beacon signals or communication messages are received from the tracked node. Since a tracking node can track multiple tracked nodes, the tracking node can have a separate counter for each tracked node. The tracking node can reset the counter of the missed intervals for the tracked node when the tracking node detects a data or network management communication or an RF alive beacon signal from the tracked node. By considering both RF alive beacon signals and other types of communication, the likelihood of a tracking node making a false positive outage determination and the likelihood that a tracking node generates an unnecessary ping are reduced.

If the tracking nodes 106 and 108a-108h in the mesh network 101 are configured to detect the operational status of the tracked nodes based on both the RF alive beacons and communication messages, the tracked nodes can be configured to transmit the RF alive beacons only when they do not transmit any communication messages for a certain period of time. The period of time may correspond to one or more alive beacon intervals.

In some cases, the nodes 106 and 108a-108h support two or more media access control (MAC) protocols and the nodes 106 and 108a-108h can be configured to transmit the RF alive beacon signals and the communication messages using different MAC protocols.

Figure 2:
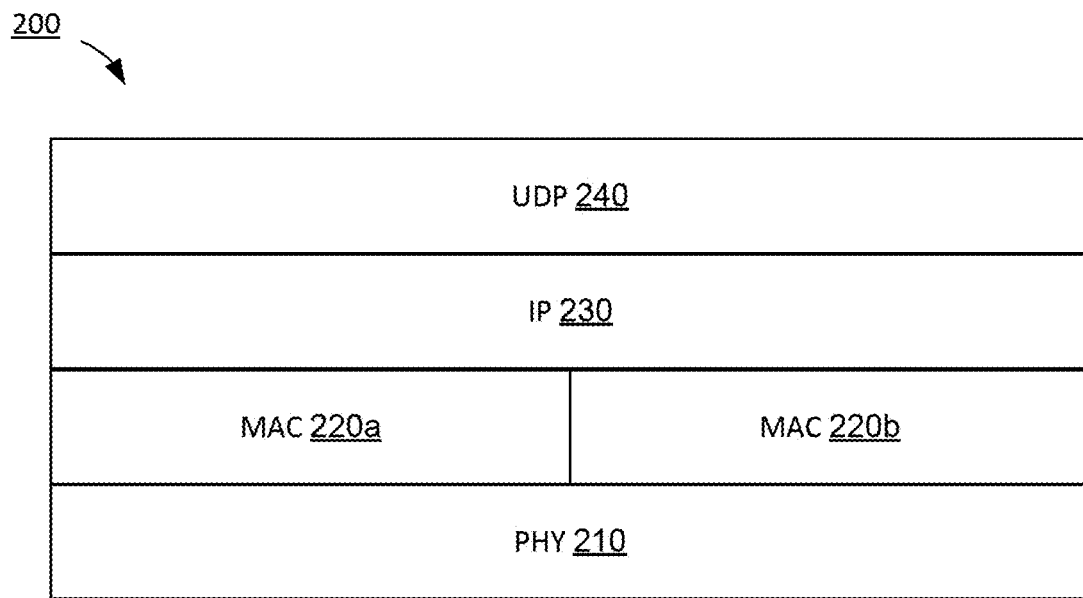
FIG. 2 is a diagram of an example protocol stack for a single radio transceiver device that implements multiple media access control protocols.

FIG. 2 is a diagram of an example protocol stack for a single radio transceiver device that implements multiple MAC protocols. The protocol stack 200 includes, at the bottom layer, the physical interface (PHY) 210. The PHY 210 can define the specifications of the physical transmission medium, such as the transceiver device of the nodes. The next layer of the protocol stack 200 for the nodes includes at least two MAC layers 220a, 220b. MAC layer 220a, for example, defines the addressing and channel access protocols for a first network, such as the mesh network 101, allowing the transceiver device to communicate with other nodes by sending and receiving communication messages. Similarly, MAC layer 220b can define the addressing and channel access protocols for a second network referred to as an RF beacon network, allowing the nodes to communicate with other nodes through RF alive beacon signals. The traffic for both MAC layer 220a and MAC layer 220b can be routed through a single IP layer 230. The signal for both networks can be communicated via a transport layer such as UDP 240. As will be described blow in detail with respect to FIG. 3, two MAC layers may be of the same protocol but operated at different points in time (e.g., in two different parts of a timeslot). Also, in some examples, MAC layer 220b (e.g., the MAC layer for the RF alive beacons) may not go to the IP layer until it performs the beacon processing scheme described above.

The mesh network 101 may follow a time-slotted channel hopping (TSCH) communication protocol to communicate data and network management messages within the network. The nodes within the network are synchronized on a current TSCH timeslot. To communicate with the RF beacon network and the mesh network 101 using a single transceiver, a node 106 or 108a-108h can switch between the mesh network 101 and the RF beacon network during a TSCH timeslot, resulting in interleaved communication with the mesh network 101 and the RF beacon network. Thus, the nodes 106 and 108a-108h can support both the mesh network 101 (operating a TSCH protocol) and the RF beacon network (which may or may not operate using the TSCH protocol) via a single transceiver device.

Each timeslot in the TSCH protocol has a time duration of duration "T" which can be defined in milliseconds or other appropriate time units. The TSCH protocol also uses multiple channel frequencies for communication between devices in the network. A hopping pattern defines the channel used to communicate during each timeslot for a node in the TSCH network. For example, a hopping pattern may determine that channel 4 is associated with timeslot 1 and channel 6 is associated with timeslot 2. A node can thus determine, based on the hopping pattern, that it should switch to channel 4 during timeslot 1 and switch to channel 6 during timeslot 2. The hopping pattern may have a hopping pattern length L and the hopping pattern repeats for every L timeslots.

Figure 3:
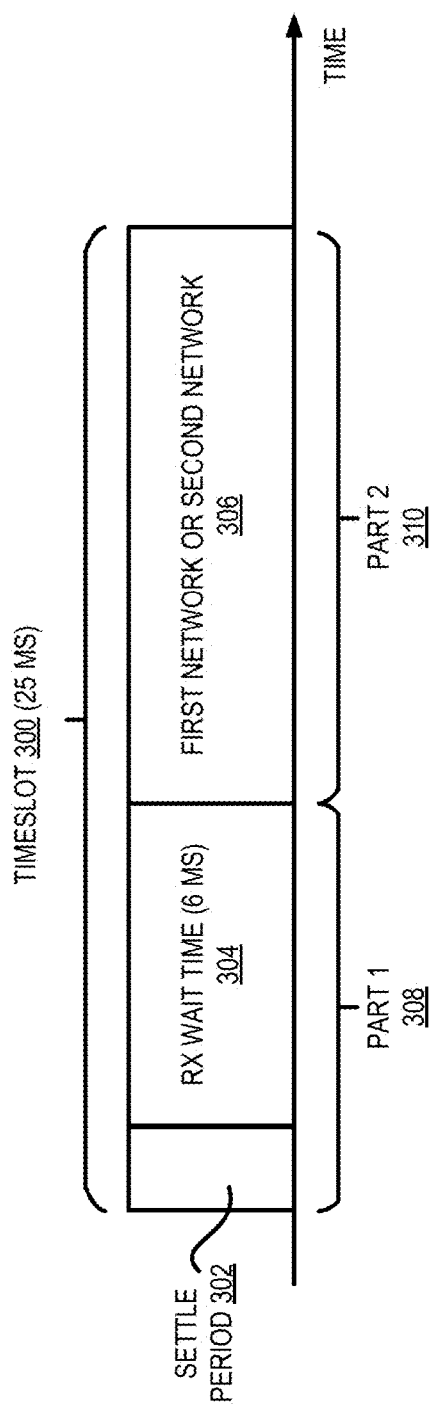
FIG. 3 is a diagram illustrating an example of a timeslot in a time-slotted channel hopping (TSCH) network.

FIG. 3 illustrates a typical TSCH timeslot structure for a timeslot 300. In this example, the time periods shown are exemplary and other values may be used in other implementations (e.g., timeslot 300 is shown with a duration of 25 milliseconds, but other durations of a timeslot are also possible). In a TSCH timeslot structure, a node listens on a channel determined by the TSCH hopping pattern during a first part 308 of the timeslot 300 for a communication on the mesh network. As shown in FIG. 3, after an RF settle period 302, the node can listen for signals on a channel for a period of time (shown as receiver wait time 304). Typically, the duration of the receiver wait time 304 is dependent on an expected transmit time duration. The transmit time duration may be defined in the IEEE 802.15.4e TSCH specification. If the node receives the start of a message prior to the expiration of the receiver wait time 304, then the node can proceed to receive the rest of the message and process the received message. However, if the node does not receive the start of a message prior to the expiration of the receiver wait time 304, then the node may determine that it will not receive a communication from another node on the mesh network during the present timeslot. In a conventional network, the remainder of the timeslot 300 may be idle or unused.

In the current disclosure, the used second part of a timeslot can be utilized for RF alive beacon communication after determining that the node will not receive a communication in the first part of that timeslot. More specifically, the node 106 or 108a-108h communicating on the mesh network 101 using the TSCH protocol can switch to the RF beacon network using another protocol during the unused time portion of a TSCH timeslot. As such, as shown in FIG. 3, in the second part of the timeslot 300, the node 106 and 108a-108h may communicate in the first network or the second network. If the node 106 or 108a-108h receives the beginning portion of a message from another node 106 or 108a-108h on the mesh network 101 during the first part 308 of the timeslot 300, the node 106 or 108a-108h can continue to receive the message in the first network during the second part 310 of the timeslot 300 (e.g., for the duration of the timeslot 300). If the node 106 or 108a-108h does not receive a message from the mesh network 101 prior to the expiration of the first part 308 of the timeslot 300, then the node 106 or 108a-108h may switch to the beacon network and begin to listen for an RF alive beacon signal from another node 106 or 108a-108h in the RF beacon network. If the node 106 or 108a-108h operates in the second part of the timeslot 300 and receives signals from the RF beacon network, the node 106 or 108a-108h can receive the message from the RF beacon network for the remaining duration of the timeslot 300. In this way, the idle time can be reduced or eliminated and the communication becomes more efficient.

Similarly, the node 106 or 108a-108h may transmit the data and network management messages on the mesh network 101 and transmit the RF alive beacon signals on the RF beacon network. In some examples, the RF alive beacon signals are transmitted at defined alive beacon intervals regardless of whether data and network management messages are transmitted within the alive beacon intervals or not. In other examples, especially when the tracking node is configured to determine the operational status of the tracked node based on both the RF alive beacon signals and the data and network management messages, the node 106 or 108a-108h can be configured to transmit the RF alive beacon signals on the RF beacon network only when no data or network management messages are transmitted on the mesh network 101 during the given alive beacon interval.

For example, during a time period when the node 106 or 108a-108h has no data or network management messages to be transmitted on the mesh network 101, the node can transmit an RF alive beacon for every alive beacon interval. In the next time period when the node 106 or 108a-108h has data or network management messages to be transmitted on the mesh network 101, the node can transmit these data or network management messages as needed. The node can further determine if it also needs to transmit RF alive beacons. If at least one of the data or network messages was transmitted during the most recent alive beacon interval, the node can skip the transmission of the RF alive beacon for this most recent alive beacon interval; otherwise, the node will transmit the RF alive beacon. In this way, the number of transmitted RF alive beacon signals is reduced.

Additionally, or alternatively, two different channels may be used for the two networks. In other words, the mesh network 101 can operate on a first channel for data and network management communications and the RF beacon network can operate on a different channel for the RF alive beacon signals. When different channels are used, the data and network management communications may use a different channel hopping sequence than the channel hopping sequence for the RF alive beacon signals. For example, the tracking node can operate on a first frequency to detect communication messages on the mesh network. If no communication messages are detected during the first part of a timeslot of the TSCH protocol, the tracking node switches to the RF beacon network during the second part of the timeslot by changing its frequency to the frequency of the RF beacon network that is different from the first frequency. This may allow the RF alive beacon signal to be transmitted at a higher power because there is less interference to the data and network management communications by the RF alive beacon signals. In one example, the RF alive beacon signals are transmitted using a power strength substantially the same as the power strength used for transmitting the communication messages. Transmitting a higher power RF alive beacon signal may increase the number of nodes 106 and 108a-108h that receive the RF alive beacon signal or increase the likelihood of a node that is within communication range of an RF alive beacon signal of receiving the RF alive beacon signal. As a result, false-positive outage detection can be reduced.

Figure 4:
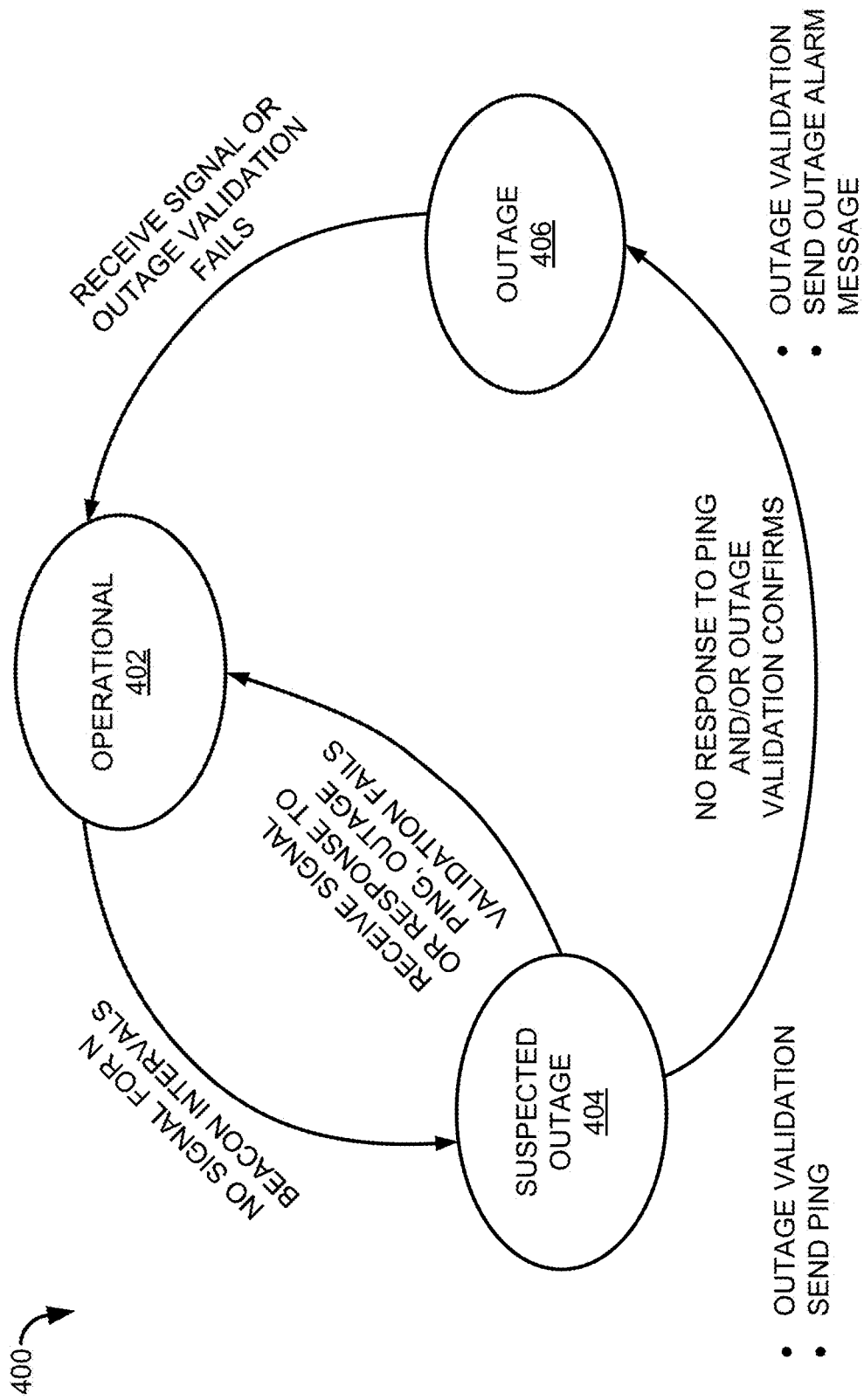
FIG. 4 is a state-transition diagram illustrating various states determined for a tracked node, in accordance with one or more examples.

FIG. 4 shows a state-transition diagram 400 illustrating various states of the tracked node determined by a tracking node, in accordance with one or more examples. As shown in FIG. 4, a tracked node can be determined to be in one of three possible states: an operational state 402, a suspected outage state 404, and an outage state 406. The tracked node is determined to be in the operational state 402 if the tracking node can regularly detect signals (RF alive beacon signals, data messages, or network management messages) transmitted from the tracked node. If, as discussed above with regard to FIG. 1, a tracking node does not detect a signal from the tracked node for a predetermined number of alive beacon intervals, the tracking node may determine that the tracked node is likely suffering a power outage and is in the suspected outage state 404.

The tracking node can validate the suspected outage state by performing an outage validation to reduce the false positive outage detection. The outage validation can be performed, for example, based on status information of the tracked node contained in advanced RF alive beacons sent by other nodes or by proactively requesting the status of the tracked node. If the outage validation fails, i.e., the outage validation process shows that the tracked node is still operational, the tracking node can mark the tracked node back to the operational state 402. In this way, the generation and transmission of an unnecessary ping can be reduced. If the outage validation confirms that the tracking node is not operational (e.g., information from other nodes show that the tracked node is in the outage state or the suspected outage state), the tracking node can further initiate the node ping process to proactively seek a response from the tracked node.

If no response to the ping is received, the tracking node can determine that the tracked node is in the outage state 406. At this point, the tracking node can be configured to transmit the outage alarm message to nodes in the next higher node level. In some implementations, the tracking node can further perform the outage validation before sending out the outage alarm message to ensure that the tracked node is indeed in the outage state 406 to further reduce the likelihood of a false positive detection of a node outage. If the outage validation fails (i.e., the outage validation shows that the tracked node is operational), the tracking node may change the status of the tracked node to the operational state 402. Further, since the promiscuous nodes are listening to network traffic, the tracking node may detect an outage alarm message or an alarm packet transmitted by other nodes in the mesh network 101. If the tracking node detects an outage alarm message or an alarm packet that identifies the tracked node, then the tracking node may refrain from initiating an outage alarm message for the tracked node or including the tracked node in an alarm packet that it creates. This provides an additional benefit of reducing network traffic.

If, while the tracked node is in the suspected outage state 404 or the outage state 406, the tracking node detects a signal originating from the tracked node, such as an RF alive beacon signal, a data message or a network management message, the tracking node can change the state of the tracked node back to the operational state 402. It should be understood that the various states and the conditions for transitioning between these states are for illustration only and should not be construed as limiting. Different conditions may trigger the transitions between these states. For example, the tracked node can transition from the suspected outage state 404 to the outage state 406 without sending the pings if the outage validation shows that the tracked node is indeed suffering an outage. Additional details regarding determining the state of the tracked node are provided below with regard to FIGS. 5-7.

Figure 5:
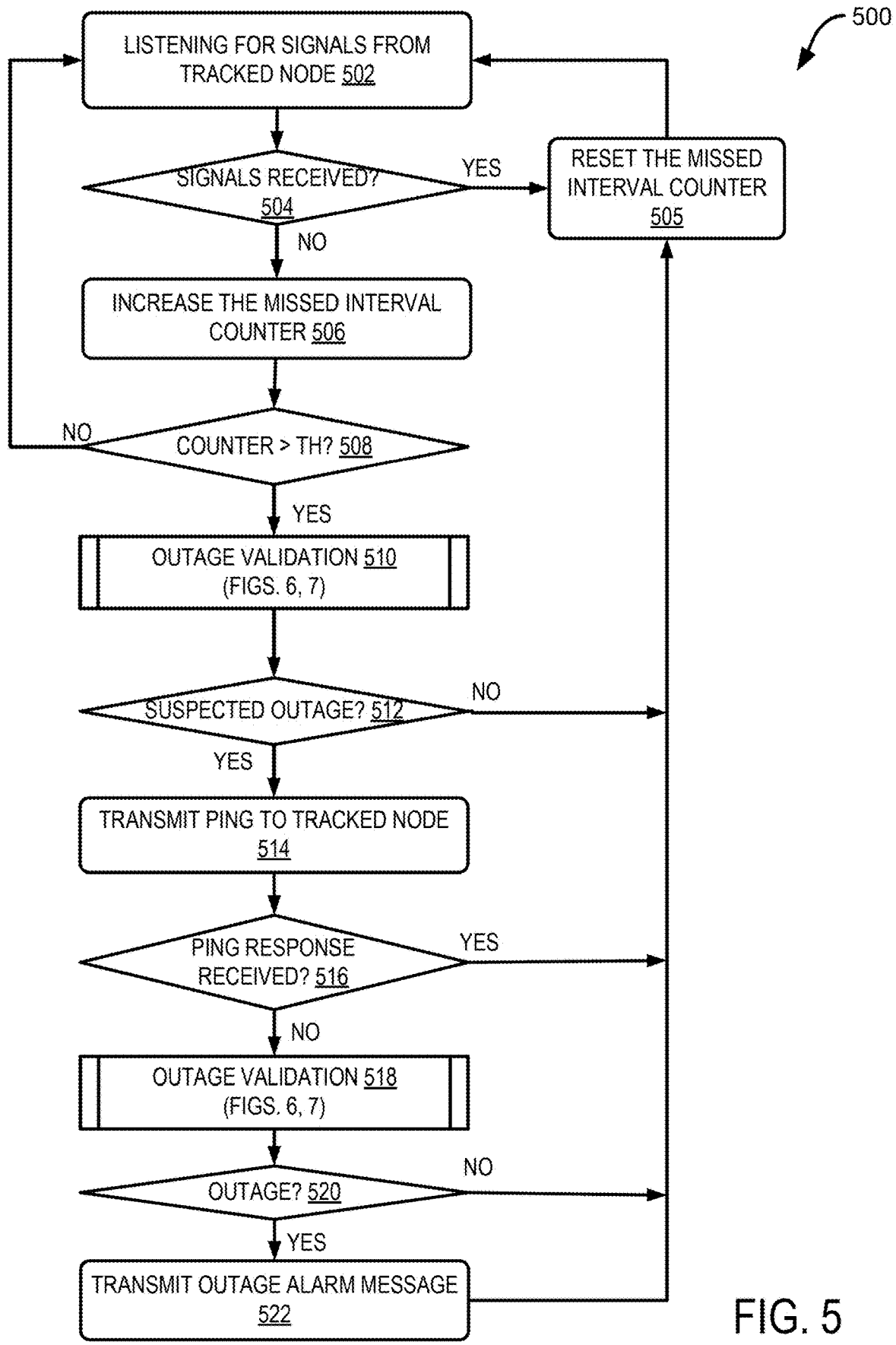
FIG. 5 shows an example of a process for detecting node outages in the networked system of FIG. 1, in accordance with one or more examples.

FIG. 5 shows an example of a process 500 for detecting endpoint outages in the networked system of FIG. 1. One or more nodes (e.g., the nodes 106 and 108a-108h) implement operations depicted in FIG. 5 by executing suitable program code. For illustrative purposes, the process 500 is described with reference to certain examples depicted in the figures. Other implementations, however, are possible.

At block 502, the process 500 involves a tracking node 106 or 108a-108h listening signals from a tracked node 106 or 108a-108h that the tracking node is tracking. As discussed above, in some examples, the tracking node may be configured to support two MAC protocols used in two networks: a TSCH protocol used by the mesh network 101 and another protocol used by the RF beacon network, such as a Wi-SUN CSMA-CA. The tracking node can listen for data or network management messages in the mesh network 101 during the first portion of the TSCH timeslot. If a communication message is not received during the first portion of the timeslot, the tracking node can switch to the RF beacon network to listen for RF alive beacon signals.

At block 504, the process 500 involves determining if the tracking node receives signals from the tracked node during the current alive beacon interval. In some examples, the tracking node determines whether RF alive beacon signals are received during the alive beacon interval. In other examples, the tracking node is capable of sniffing or listening for any type of communications sent by the tracked node. In these examples, the tracking node can consider both RF alive beacon signals and communication messages sent by the tracked node to determine whether the tracked node is operational or not. As such, if the tracking node detects either an RF alive beacon signal or a data or network management message sent by the tracked node during the alive beacon interval, the tracking node can determine that a signal is received from the tracked node.

If at least a signal is received from the tracked node, the process 500 involves resetting a missed interval counter to zero at block 505 and then at block 502 continuing to listen for signals from the tracked node. If no signals are received from the tracked node during the current alive beacon interval, the tracking node increases the missed signal counter by one at block 506. At block 508, the tracking node determines whether the missed interval counter is higher than a threshold number of missed intervals. If not, the tracking node continues to listen for signals from the tracked node at block 502.

If the missed interval counter is higher than the threshold, the tracking node may determine that the tracked node is in the suspected outage state. At block 510, the process 500 involves performing outage validation to confirm that the tracked node is indeed not operational and to update the status of the tracked node based on the outage validation. The outage validation can be performed based on additional information obtained from other nodes, such as the status of the tracked node contained in an advanced RF alive beacon signal sent by another node, or a response to a request for the status of the tracked node sent by the tracking node. Two examples of the outage validation are described below with respect to FIGS. 6 and 7. The tracking node may perform the outage validation using either one or both of the outage validation methods shown in FIGS. 6 and 7.

At block 512, the process 500 involves determining if the tracked node is determined to be in the suspected outage state. The determination can be based on the outcome of the outage validation. If the outage validation fails, which means that the tracked node is still operational, the process 500 involves resetting the missed interval counter at block 505 and continue to listen for signals from the tracked node at block 502. If the outage validation confirms that the tracked node is in the suspected outage state, the process 500 involves, at block 514, initiating an node ping process by transmitting a ping to the tracked node. The ping may be a signal requesting a response from the tracked node, and the ping may be transmitted using a full power strength of the tracking node. In an example, the full power strength may be between 20 dBm and 30 dBm, but other signal strengths are also contemplated. The full power strength of the ping may be significantly larger than the strength of an RF alive beacon signal to ensure that the tracked node has a much better opportunity to receive the ping.

At block 516, the process 500 involves determining if a ping response is received by the tracking node from the tracked node within a response period. The response period can be set to be tens of milliseconds and up to a few seconds. If the ping response is received by the tracking node, the missed interval counter is reset at block 505. In resetting the missed interval counter, the tracked node is identified as in the operational state and the tracking node continues to listen for signals from the tracked node. If the ping response is not received by the tracking node from the tracked node, the process 500 may involve another outage validation at block 518 similar to the outage validation performed at block 510. If the outage validation confirms that the tracked node is indeed in the outage state, the tracking node can transmit, at block 522, an outage alarm message indicating the outage status of the tracked node to nodes in a next higher node level. If the outage validation shows that the tracked node is still operational, the process 500 involves resetting the missed interval counter at block 505 and the tracking node continues to listen for signals from the tracked node at block 502.

It should be appreciated that the process 500 described above with respect to FIG. 5 are for illustration purposes and should not be construed as limiting. The blocks of the process 500 can be executed in a different order than that shown in FIG. 5. In addition, the process 500 may involve more or fewer blocks than those shown in FIG. 500. For example, the outage validation in block 510, the outage validation in block 518, or both can be omitted from the process 500. In another example, an additional block can be added to the process 500 before transmitting the outage alarm message to determine whether the outage status of the tracked node has been reported in an alarm message sent by another node. If so, the tracking node may refrain from sending the outage alarm message thereby reducing the network traffic.

Figure 6:
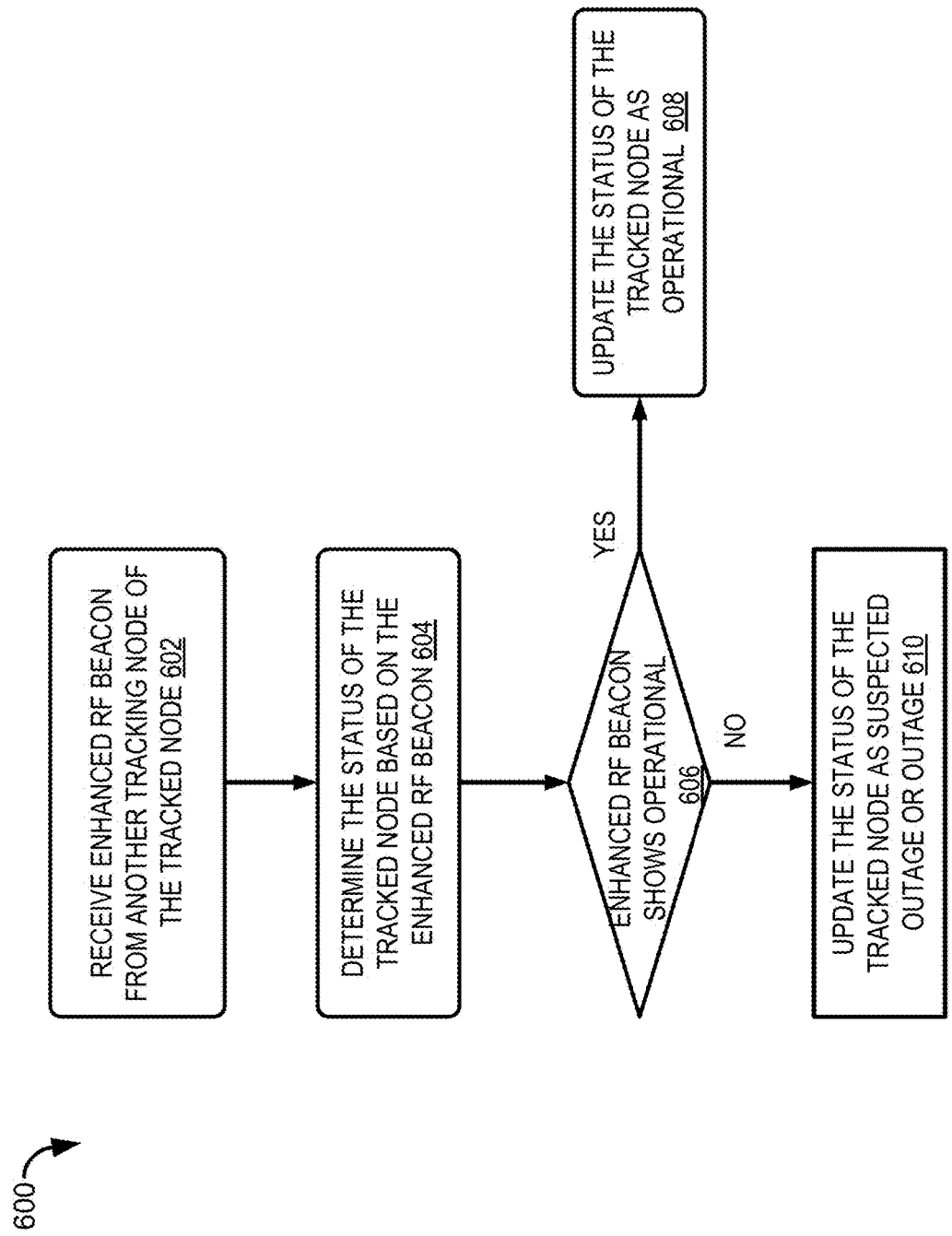
FIG. 6 shows an example of a process for validating the status of the tracked node in the networked system of FIG. 1, in accordance with one or more examples.
Figure 7:
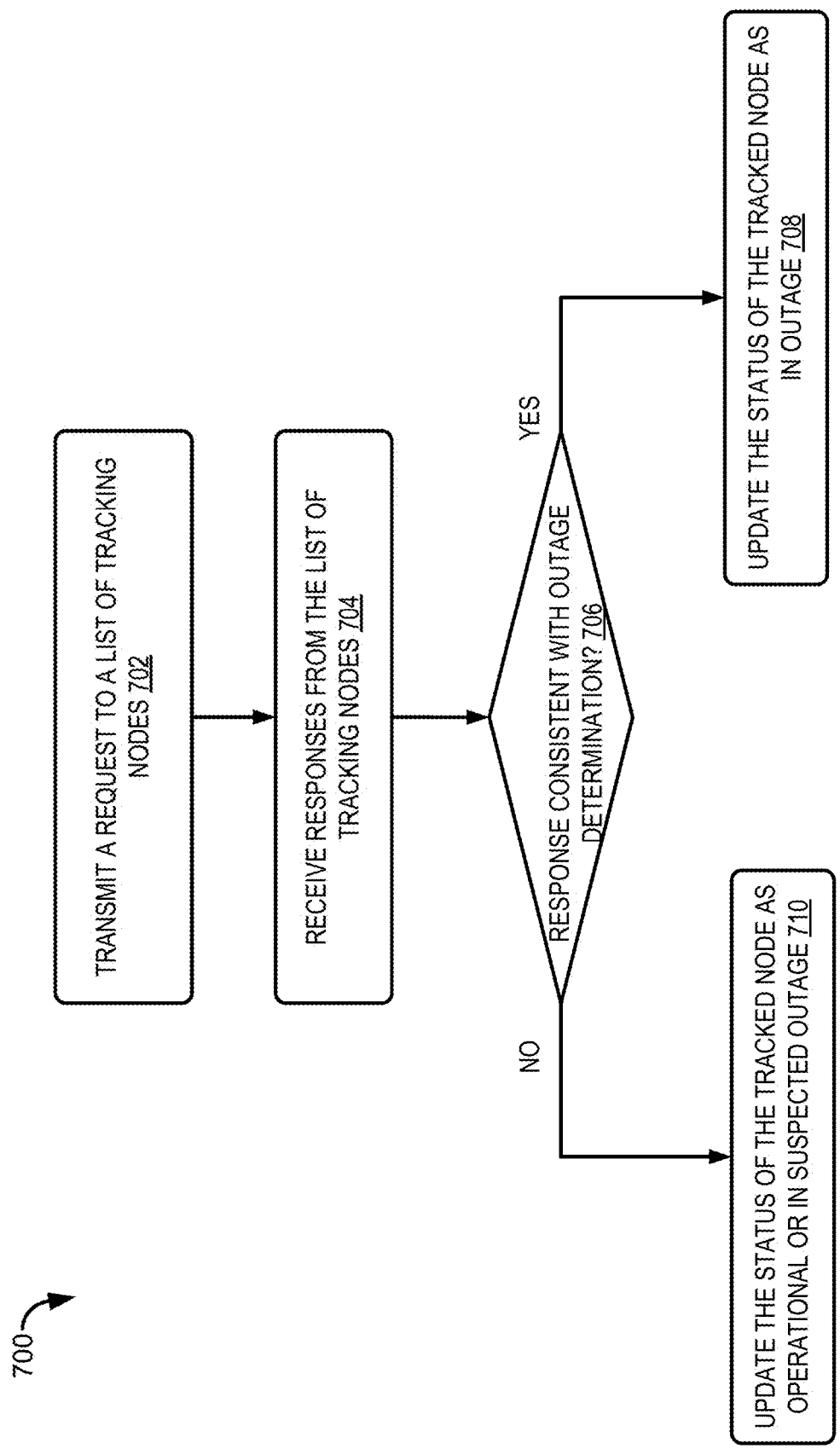
FIG. 7 shows another example of a process for validating the status of the tracked node in the networked system of FIG. 1, in accordance with one or more examples.

As discussed above, a node may be tracked by multiple tracking nodes. As such, these multiple tracking nodes can collaborate with each other (e.g., exchanging data with each other) when determining the status of the tracked node. This can increase the accuracy of the status determination of the tracked node and reduce the false-positive rate of the detection. This process includes the outage validation process described above in blocks 510 and 518 of FIG. 5. FIGS. 6 and 7 each show an example of the outage validation processes.

In particular, FIG. 6 shows an example of a process 600 for validating the outage status of a tracked node based on advanced RF alive beacon signals sent by other tracking nodes of the tracked node. At block 602, the process 600 involves receiving advanced RF alive beacon signals from another tracking node of the tracked node. In this example, the nodes in the mesh network 101 are configured to include additional information in the RF alive beacon signal, i.e., advanced RF alive beacon signal. In addition to the identification of the node transmitting the RF alive beacon signal, the advanced RF alive beacon signal can further include information about the nodes that it is tracking. The information about the tracked nodes may include information identifying the tracked nodes and the status of each tracked node. In addition to the information identifying the tracked nodes and the status information, the advanced RF alive beacon signal may also include a time stamp for the most recently received RF alive beacon signal or other communication received from each tracked node. The information may include all tracked nodes or only those tracked nodes having a certain status, e.g., those nodes that the transmitting node has determined to be in the suspected outage state or in the outage state. In some implementations, the nodes 106 and 108*a*-108*h* in the mesh network 101 are all configured to transmit advanced RF alive beacon signals.

At block 604, the process 600 involves parsing the advanced RF alive beacon signal to determine the status of the tracked node. At block 606, the process 600 involves determining whether the advanced RF alive beacon signal shows that the tracked node is operational. If so, the process 600 involves updating the tracked node as operational at block 608. For example, the status of the tracked node can be updated by comparing the time stamp in the advanced RF alive beacon with the time stamp of a most recent signal received by the tracking node from the tracked node. The tracked node can be determined to be in the operational state if the time stamp in the advanced RF alive beacon is later than the time stamp for the most recent signal received by the tracking node from the tracked node and it shows that the tracked node sent a signal during the current time interval. In another example, the tracked node can be marked as in the operational state if the advanced RF alive beacon shows that the tracked node is operational.

If the advanced RF alive beacon signal shows that the tracked node is not operational, the process 600 involves marking, at block 610, the tracked node as in the suspected outage state or in the outage state depending on the status determined by the tracking node. For example, if the tracking node invoked the outage validation when the status of the tracked node is determined to be suspected outage (e.g., after the tracking node fails to receive signals from the tracked node for more than the threshold number of missed intervals and before pinging the tracked node), the tracking node may determine that the tracked node is in the suspected outage state if the advanced RF alive beacon also shows that the tracked node is in the suspected outage or in the outage state. In some implementations, if the advanced RF alive beacon shows that the tracked node is in the outage state, the tracking node may determine that the tracked node is in the outage state even if it determines that the tracked node is in the suspected outage state. This can eliminate the endpoint pinging process.

Likewise, if the tracking node invoked the outage validation when the status of the tracked node is determined to be in the outage state (e.g., after the tracking node fails to receive the response to the ping), the tracking node may determine that the tracked node is in the outage state if the advanced RF alive beacon shows that the tracked node is in the suspected outage or in the outage state. It should be further appreciated that the tracking node may further use the additional information about the tracked node in the advanced RF alive beacon signals to determine how to prepare its own RF alive beacon signal, outage alarm message, or alarm packet, such as refraining from generating and transmitting outage alarm message if the outage has been reported by other tracking nodes.

FIG. 7 shows an example of a process 700 for validating the outage status of a tracked node by communicating with other tracking nodes of the tracked node. At block 702, the process 700 involves the tracking node transmitting a request to other tracking nodes of the tracked node to obtain information about the tracked node to verify its determination of an outage. In one implementation, the tracking node maintains information about other nodes that are tracking the same tracked node and sends the request to those nodes. Alternatively, or additionally, the tracking node may send the request to its neighboring nodes. The neighboring nodes that also track the same tracked node may respond to the request. The node may send the request using any method described herein, e.g., via RF alive beacon signals, data messages, network management messages, or any combination thereof. The request may be a unicast or broadcast communication and in some instances is sent at a reduced power level. The request may use the same network protocol used for other types of communication or may use a local protocol.

At block 704, the process 700 involves receiving responses from the tracking nodes. The responses contain information about the tracked node that is determined by the respective tracking nodes. At block 706, the process 700 involves determining whether the status of the tracked node in the responses are consistent with the outage determination by the tracking node. If so, the process 700 involves marking the tracked node as in the outage state or in the suspected outage state depending on the status of the tracked node determined by the tracking node itself at block 708. If the status of the tracked node in the responses are inconsistent with the outage determination by the tracking node, the tracking node may, at block 710, wait an additional amount of time before reporting the outage (e.g., mark the tracked node as operational but assign the counter of missed intervals to a non-zero value) or take further actions such as send another ping to the tracked node (e.g. by marking the tracked node as in suspected outage state). By validating the outage of the tracked node in this way, the global network traffic (e.g., the outage alarm message) can be reduced even though the local traffic is increased.

Exemplary Node

Figure 8:
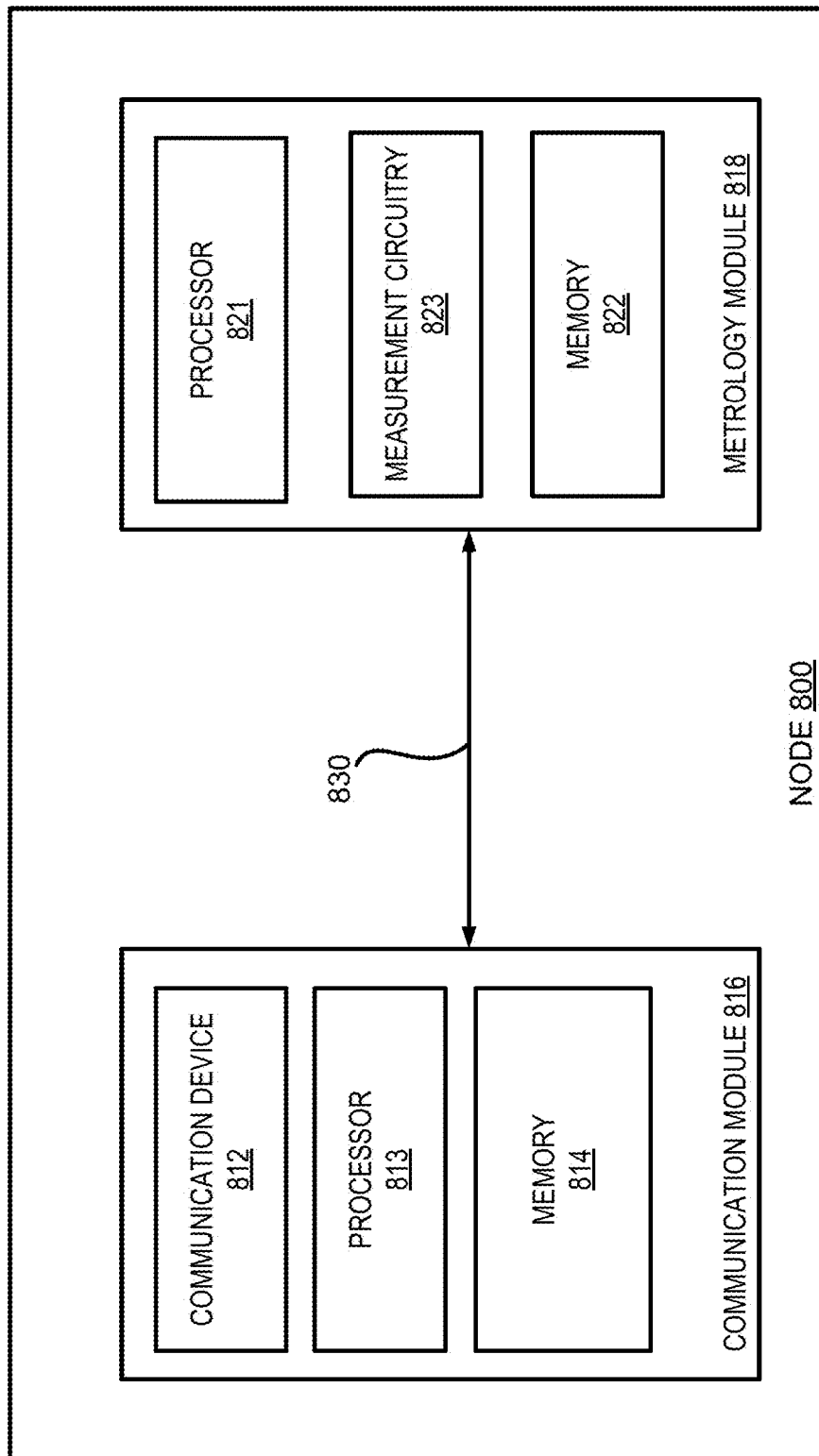
FIG. 8 is an example of a block diagram of a node of the networked system of FIG. 1, in accordance with one or more examples.

FIG. 8 is an example of a block diagram of components of a node 106 or 108 of the mesh network 101. Some or all of the components of a computing system 800 can belong to one or more of the nodes 106 or 108a-108h of FIG. 1. The node 800 includes a communication module 816 and a metrology module 818 connected through a local or serial connection 830. The function of the communication module 816 includes sending and receiving various signals to and from other nodes in the mesh network 101 or RF beacon network, such as RF alive beacons (including advanced RF alive beacons), data and network communication messages, outage alarm messages and other data.

The communication module 816 may include a communication device 812 such as an antenna and a radio. Alternatively, the communication device 812 may be any device that allows wireless or wired communication. The communication device 812 may include a transceiver device, such as an RF transceiver, capable of transmitting and receiving RF communication from other nodes in the mesh network 101. In some configurations, the transceiver device is capable of implementing at least two MAC interfaces to communicate with the mesh network 101 and the RF beacon network via two antennas, respectively or via a single antenna. The communication module 816 may also include a processor 813, and memory 814. The processor 813 controls functions performed by the communication module 816, such as the one or more of the operations described above with respect to FIGS. 1-7. The memory 814 may be utilized to store data used by the processor 813 to perform its function.

The function of the metrology module 818 includes the functions necessary to manage the resource, in particular, to allow access to the resource and to measure the resource used. The metrology module 818 may include a processor 821, memory 822, and measurement circuitry 823. The measurement circuitry 823 handles the measuring of the resource and may be used as the sensor to collect sensor data. The processor 821 in the metrology module 818 controls functions performed by the metrology module 818. The memory 822 stores data needed by the processor 821 to perform its functions. The communication module 816 and the metrology module 818 communicate with each other through the local connection 830 to provide data needed by the other module. Both the communication module 816 and the metrology module 818 may include computer-executable instructions stored in memory or in another type of computer-readable medium and one or more processors within the modules may execute the instructions to provide the functions described herein.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

The invention claimed is:

1. A method for detecting node outage in a mesh network, comprising:
    during a first time period:
        detecting, by a first node of the mesh network, a set of signals originating from a second node of the mesh network tracked by the first node, wherein the set of signals comprises RF alive beacons and communication messages transmitted by the second node, the RF alive beacons indicating an operational status of the second node, and wherein the set of signals are detected during a time period that corresponds to at least a single alive beacon interval;
    during a second time period, subsequent to the first time period:
        determining, at the first node, that a threshold number of the alive beacon intervals have passed since receiving a most recent signal from the second node;
    outputting, from the first node, a ping to the second node requesting a response to the ping; and
    when no response to the ping is received from the second node within a response period, transmitting, by the first node, an outage alarm message to a next topologically higher layer of the mesh network, the outage alarm message comprising an identification of the second node.

2. The method claim 1, further comprising:
    prior to transmitting the outage alarm message to a next topologically higher layer of the mesh network:
        detecting a second outage alarm message sent by a third node;
        determining that the second outage alarm message comprises an identification of the second node; and
        excluding the identification of the second node from the outage alarm message to be transmitted by the first node to the next topologically higher layer of the mesh network.

3. The method of claim 1, wherein the communication messages comprise data messages and network management messages.

4. The method of claim 1, wherein the RF alive beacons are sent by the second node when no communication messages are sent during an alive beacon interval.

5. The method of claim 1, wherein the first node is configured to communicate with the mesh network using a time-slotted channel hopping (TSCH) protocol and with a second network using a second protocol, and wherein detecting the set of signals originating from the second node of the mesh network comprises:
    detecting, on the mesh network, one of the communication messages during a first part of one timeslot of the TSCH protocol; or
    detecting, on the second network, one of the RF alive beacons during a second part of another timeslot of the TSCH protocol.

6. The method of claim 5, wherein detecting one of the RF alive beacons during the second part of another timeslot of the TSCH protocol comprises changing a frequency of the first node to a frequency of the second network that is different from a frequency used during a first part of the another timeslot of the TSCH protocol.

7. The method of claim 5, wherein detecting one of the RF alive beacons during the second part of another timeslot of the TSCH protocol comprises remaining on a frequency used during a first part of the another timeslot of the TSCH protocol.

8. A node in a mesh network, comprising:
    a processor configured to execute computer-readable instructions;
    a memory configured to store the computer-readable instructions that, when executed by the processor, cause the processor to perform operations comprising:
    during a first time period:
        detecting a set of signals originating from a second node of the mesh network tracked by the node, wherein the set of signals comprises RF alive beacons and communication messages transmitted by the second node, the RF alive beacons indicating an operational status of the second node, and wherein the set of signals are detected during a time period that corresponds to at least a single alive beacon interval;
    during a second time period, subsequent to the first time period:
        determining that a threshold number of the alive beacon intervals have passed since receiving a most recent signal from the second node;
    outputting a ping to the second node requesting a response to the ping; and
    when no response to the ping is received from the second node within a response period, transmitting an outage alarm message to a next topologically higher layer of the mesh network, the outage alarm message comprising an identification of the second node.

9. The node of claim 8, further comprising:
    a transceiver device configured to communicate with the mesh network using a time-slotted channel hopping (TSCH) protocol and with a second network using a second protocol, wherein detecting the set of signals originating from the second node of the mesh network comprises:
        detecting, on the mesh network, one of the communication messages during a first part of one timeslot of the TSCH protocol; or
        detecting, on the second network, one of the RF alive beacons during a second part of another timeslot of the TSCH protocol.

10. The node of claim 9, wherein detecting one of the RF alive beacons during the second part of another timeslot of the TSCH protocol comprises changing a frequency of the node to a frequency of the second network that is different from a frequency used during a first part of the another timeslot of the TSCH protocol.

11. The node of claim 9, wherein detecting one of the RF alive beacons during the second part of another timeslot of the TSCH protocol comprises remaining on a frequency used during a first part of the another timeslot of the TSCH protocol.

12. The node of claim 8, wherein the operations further comprise:
- prior to transmitting the outage alarm message to a next topologically higher layer of the mesh network:
  - detecting a second outage alarm message sent by a third node;
  - determining that the second outage alarm message comprises an identification of the second node; and
  - excluding the identification of the second node from the outage alarm message to be transmitted by the node to the next topologically higher layer of the mesh network.

13. The node of claim 8, wherein the communication messages comprise data messages and network management messages.

14. The node of claim 8, wherein the RF alive beacons are sent by the second node when no communication messages are sent during an alive beacon interval.

* * * * *